United States Patent [19]

Suzuki

[11] Patent Number: 4,755,695

[45] Date of Patent: Jul. 5, 1988

[54] LOGIC GATE HAVING LOW POWER CONSUMPTION

[75] Inventor: Tomihiro Suzuki, Osaka, Japan

[73] Assignee: Sumitomo Electric Industries, Ltd., Osaka, Japan

[21] Appl. No.: 893,496

[22] Filed: Aug. 5, 1986

[30] Foreign Application Priority Data

Aug. 9, 1985 [JP] Japan .......................... 60-176587

[51] Int. Cl.⁴ .................. H03K 19/017; H03K 17/16; H03K 19/094; H03K 3/26
[52] U.S. Cl. ................................. 307/448; 307/443; 307/450; 307/285
[58] Field of Search .............. 307/448, 443, 450, 285

[56] References Cited

U.S. PATENT DOCUMENTS 4,558,235 12/1985 White et al. .................. 307/450

OTHER PUBLICATIONS

*Introduction to VLSI Systems,* Mead & Conway Copyright 1980 by Addison–Wesley Publishing Company, Inc.

Primary Examiner—John S. Heyman
Assistant Examiner—M. R. Wambach
Attorney, Agent, or Firm—W. G. Fasse; D. H. Kane, Jr.

[57] ABSTRACT

A semiconductor logic circuit device uses a plurality of MESFETs and a Schottky barrier diode (11) interconnected in such a way that one MESFET forms a switching input (9), another MESFET may form a load (8), still another MESFET forms a buffer amplifier stage (10), a further MESFET forms a current source, and the Schottky barrier diode operates as a speed-up capacitor for increasing the response characteristic of the buffer stage. Different types of logic circuits may be formed.

9 Claims, 5 Drawing Sheets

LOGIC GATE HAVING LOW POWER CONSUMPTION

BACKGROUND OF THE INVENTION

1. Field of the Invention

The present invention relates to a semiconductor device, specifically to an integrated circuit employing a Schottky gate field effect transistor (metal-semiconductor field effect transistor MESFET). More specifically, it relates to a circuit construction of a logic gate composed of MESFETs using compound semiconductors.

2. Description of the Prior Art

An integrated circuit employing silicon (Si) as a semiconductor material is inferior to an integrated circuit employing a compound semiconductor such as GaAs as a semiconductor material, with regard to the speed of operation the power consumption, etc. A compound semiconductor integrated circuit formed of GaAs or the like has superior characteristics such as an increased speed of operation a reduced power consumption. Therefore, utilization of the integrated circuit employing a compound semiconductor to a digital application field is strongly desired. A compound semiconductor integrated circuit, such as a GaAs integrated circuit, is composed of Schottky-gate field-effect transistors (MESFETs) and hence differs from an Si integrated circuit.

Various circuits employing MESFETs have become known for forming a logic gate which is an extremely important circuit component in digital integrated circuits.

Figure 1:
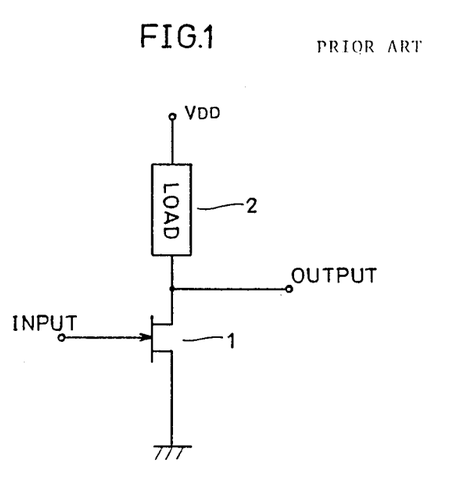
FIG. 1 is a schematic diagram of a conventional DCFL circuit which is a typical logic gate circuit employing a MESFET.

FIG. 1 shows a structure of a DCFL (direct-coupled FET logic) circuit which is one example of a typical conventional logic gate employing MESFETs.

Referring to FIG. 1, the DCFL circuit comprises a normally-off type MESFET 1 with its gate receiving an input signal, its source being connected to the ground, and its drain providing an output signal. A load 2 is connected between the drain of the MESFET 1 and a power supply $V_{DD}$. The load 2 may be a resistor or a MESFET.

The DCFL circuit has a small power consumption and therefore it is suitable for a very large scale integrated circuit (VLSI). However, the DCFL circuit has a disadvantage in that it has a small logical swing. More specifically the logical swing of the DCFL circuit output is usually about 500 mV, since the logical high level thereof is clamped by the forward threshold voltage of the Schottky gate and the logical low level thereof is at a potential slightly higher than the ground level (normally 0.2 V). Consequently, the noise margin and the margin for any threshold voltage variation of the MESFET are not large enough in the DCFL circuit.

In addition, the low level output potential needs to be sufficiently low in the DCFL circuit, so that a resistor having a large resistance value or a MESFET which passes a sufficiently small current, must be used as the load 2. If the circuit output is taken off between the load 2 and the drain of the MESFET 1 as shown in FIG. 1, the current drivability of the output is small since the load 2 has an effectively large resistance value. Specifically, if the DCFL circuit is used as a current source, the drivability of this current source is extremely small.

As described above, the DCFL circuit is not suitable for a circuit comprising a long wiring and/or a large number of fan-outs or branches.

Figure 2:
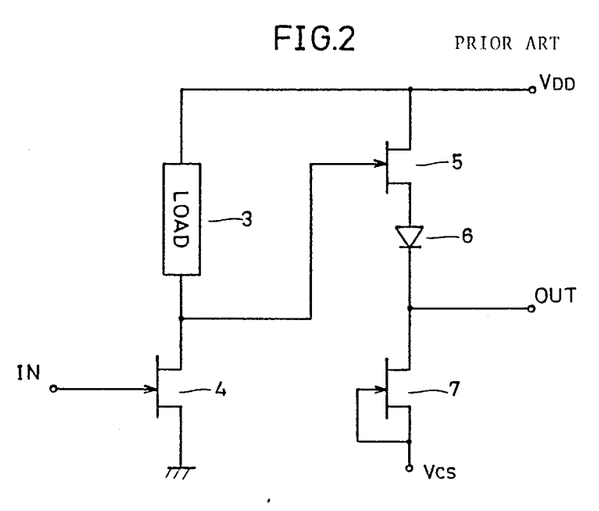
FIG. 2 is a schematic diagram of a conventional BFL circuit which is another typical logic gate circuit employing a MESFET.

FIG. 2 shows a structure of a BFL (Buffered FET Logic) circuit which is another example of a conventional logic gate employing MESFETs.

Referring to FIG. 2, the BFL circuit comprises a combination of a switching stage performing a switching operation in response to an input signal, and a buffer stage for a current amplification and for a level shift of the switching stage output (i.e. the drain output of the MESFET 4).

The switching stage comprises a normally-on type MESFET 4 with its gate receiving an input signal, its source connected to ground potential and its drain connected to a power supply $V_{DD}$ through the load 3 and to the gate of the MESFET 5. The load 3 maybe a resistor or a MESFET.

The buffer stage comprises a normally-on type MESFET 5 having its drain connected to the power supply $V_{DD}$, its gate is connected to the drain of the MESFET 4, and its source is connected to the anode of a Schottky barrier diode 6. The Schottky barrier diode 6 shifts the level of an output signal and has its anode connected to the source of the MESFET 5, its cathode connected to the drain of the MESFET 7, an output terminal and a normally-on type MESFET 7 having its drain connected to the cathode of the diode 6 and its gate and source both connected to a potential $V_{CS}$.

In the BFL circuit, a MESFET having a threshold voltage of −0.5 V to −2.0 V is commonly used, whereby the logical swing of the output becomes as large as about 1.5 V. Since the BFL circuit has a large logical swing, it provides enough margin for the variation of the threshold voltage. The noise margin thereof is also large.

In addition, in the BFL circuit, the normally-on type MESFET which has larger current drivability compared with the normally-off type MESFET, is used. Furthermore, the BFL circuit has a buffered amplifying stage. Accordingly, the current drivability of the BFL circuit output is larger than that of the DCFL circuit. The BFL circuit has superior characteristics in the logical swing in the current drivability, etc. However, the power consumption of the BFL circuit is as large as 1 mW to several mW per gate. Therefore, the BFL circuit is not suited as a circuit structure forming a large scale integrated circuit.

Further, power is constantly consumed in the buffered amplification stage in the BFL circuit. Therefore, it is not an effective circuit in terms of the gate power consumption with respect to the current drivability at the time of gate switching.

In addition, the BFL circuit comprises at least one diode for a level shift. Therefore, it is difficult to reduce the logical swing of the output to a value smaller than 1.5 V.

Generally, the variation of the threshold voltage in a wafer surface has been a problem in fabricating a MESFET IC on a GaAs substrate. The GaAs ICs cannot be fabricated with a high yield unless the threshold voltages in the wafer surface are uniformly distributed. The conventional fabrication technique results in MESFETs having a substantial variation of threshold voltages, fabrication technique, so that a difficult technical problem arises in the application of the DCFL circuit having a small logical swing as described with reference to FIG. 1, to the GaAs IC. It appears that the threshold voltage of the DCFL circuit is somehow related to dislocations in the wafer or to other crystalline defects. However, a direct relationship has not yet been established. Recently, it has become possible to keep variations of the threshold voltage to less than several 10 mV in an IC comprising MESFETs fabricated on a GaAs wafer. The reason for these relatively low variations appears to be that it has become possible to fabricate GaAs single crystals with with a sufficiently high uniformity. If the variations of the threshold voltage are several 10 mV, a logical swing as large as 1.5 V in the BFL circuit means that the margin for the threshold voltage is too large. Therefore, a power consumption as small as possible is more desirable than the large output logical swing of 1.5 V of the BFL circuit. In other words, the large power consumption of the BFL circuit has become a big problem.

SUMMARY OF THE INVENTION

A principal object of the present invention is to eliminate the above described defects of the prior logic circuits employing MESFETs. More specifically, it is the object of the present invention to provide a novel logic gate circuit employing MESFETs which have a small power consumption but enough current drivability at the time of the switching operation, and which also provide a sufficient logical swing for forming a large scale integrated circuit.

A semiconductor device according to the present invention comprises a switching stage including a load having its one terminal connected to a first supply potential and at least one first MESFET connected between the other terminal of the load and a second supply potential. The on/off operation of the switching stage is controlled in response to an input signal. The device further includes a buffer stage comprising a second MESFET connected to receive the switching stage output at the gate of the buffer stage and having one conduction terminal connected to the first supply potential, a third MESFET having one conduction terminal connected to the other conduction terminal of the second MESFET and the other conduction terminal and its gate connected to a third supply potential. The device also includes a Schottky barrier diode having its cathode connected to the gate of the second MESFET and the switch stage output and its anode connected to a junction of the second and third MESFETs.

The level shift amount of the switching stage output, by the buffered amplification stage is determined by properly setting the respective threshold voltages or the values of the gate width of the second and third MESFETs.

In the above described structure, the Schottky barrier diode functions as a speed up capacitance which ensures a rapid switching operation while the second and third MESFETs amplify and level shift the output of the switching stage. Accordingly, a logic gate circuit can be implemented with a proper output logical swing, a low power consumption, a rapid operation, and a high load drivability.

These objects and other objects, features, aspects and advantages of the present invention will become more apparent from the following detailed description of the present invention when taken in conjunction with the accompanying drawings.

DESCRIPTION OF PREFERRED EMBODIMENTS AND OF THE BEST MODE OF THE INVENTION

Figure 3:
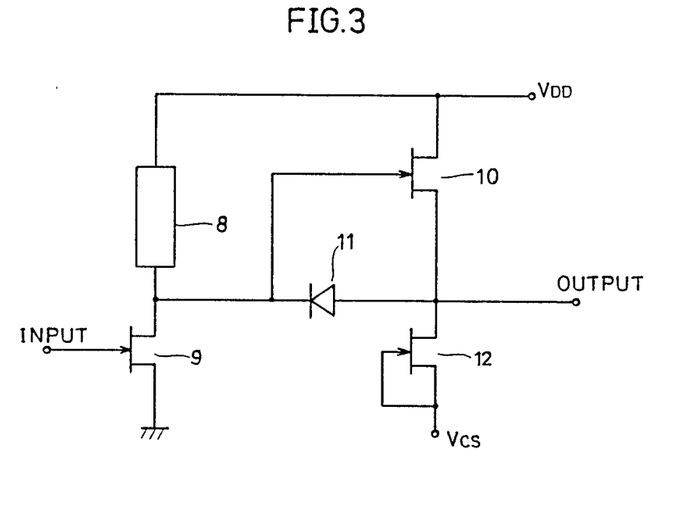
FIG. 3 is a schematic diagram of a logic gate circuit according to one embodiment of the present invention.

Referring to FIG. 3, the present logic gate circuit forms an inverter, comprising a switching stage for performing a switching operation in response to an input signal and a buffer stage for amplifying and level shifting the switching stage output.

The switching stage comprises a MESFET 9 receiving an input signal at it gate and having its drain connected to one terminal of a load 8, to a gate of a MESFET 10, and to the cathode of a Schottky barrier 11. The source of the MESFET 9 is connected to ground potential. The load 8 having its one terminal connected to the drain of the MESFET 9, has its other terminal connected to a first supply potential $V_{DD}$.

A Schottky-gate field effect transistor of the normally-off type, or a Schottky-gate field effect transistor operating in a shallow normally-on region is used as the input MESFET 9. A resistor or a MESFET which is an active load, is used as the load 8.

The buffer stage comprises a MESFET 10 receiving the switching stage output at its gate and having its drain connected to said first supply potential $V_{DD}$. The source of the MESFET 10 is connected to the drain of a MESFET 12 and to an anode of the Schottky barrier diode 11. The MESFET 12 has its drain connected to the source of the MESFET 10 and to the anode of the Schottky barrier diode 11. The source of the MESFET 12 is connected to a second supply potential $V_{CS}$. The Schottky barrier diode 11 is connected with its cathode to the switching stage output at the gate of the MESFET 10 and with its anode connected to the node between the MESFETs 10 and 12. The MESFET 12 functions as a current source.

The Schottky barrier diode 11 is reversely biased and connected between the gate and source of the MESFET 10. This Schottky barrier diode 11 operates as a speed-up capacitor for increasing the response characteristic or speed of the buffer stage. The reverse bias potential for the Schottky barrier diode 11 is the difference between the buffer stage output potential and the switching output potential, namely, the level shift potential caused by the buffer stage.

The difference of the level shift potential caused by the buffer stage can be readily provided to the extent of about 0.6 V by making the width of the gate of the MESFET 12 wider than the gate width of the MESFET 10 (provided that the gate lengths are the same) or by setting the threshold voltage of the MESFET 12 more on the on-side than the threshold voltage of the MESFET 10 (i.e., increasing the absolute value of the threshold voltage). Therefore, the value of the output logical swing surely becomes 0.6 to 1.2 V which is necessary and sufficient for implementing a large scale integrated circuit.

The threshold voltage of the MESFET 9 can be arbitrarily set in a region ranging from normally-off to a shallow normally-on. This is because the buffer stage provides an input signal which is properly level shifted. Accordingly, in comparison with a conventional DCFL circuit, a sufficient margin for a very wide range of variation of the threshold voltage can be provided by the present circuit.

The circuit operation is similar to that of a common inverter circuit, namely, an input signal applied to the gate of the MESFET 9 is inverted at the switching stage and then properly level shifted by the buffer stage before the signal appears at the output.

The above described circuit structure provides the following advantages.

(1) The output logical swing is set in a suitable range of 0.6 to 1.2 V. This value is necessary and sufficient for implementing a large scale integrated circuit. In addition, even if there are substantial variations of the threshold voltages of the MESFETs on a wafer surface, the margin for the threshold voltage variation is sufficient, since the logical swing is larger than 0.6 V.

(2) The reversely biased Schottky barrier diode functions as a speed-up capacitor. Accordingly, it is superior to a conventional gate device of a low power consumption type such as a DCFL circuit in the operation speed and the current drivability at the time of switching, etc.

(3) Since the buffer stage functions as a level shifter, sufficient operation margin can be obtained even if the logical low level of the switching stage is set rather high. Therefore, the resistance value of the load resistance 8 can be decreased. If an active in the form of a MESFET is used, the value of the current flowing therethrough can be increased for enhancing the current drivability of the gate circuit.

(4) A speed-up capacitance is provided by the reversely biased Schottky barrier diode. Accordingly, a large current can flow transiently at the switching time.

If the gate circuit drives a capacitance load, the function of the speed-up capacitor is decreased. However, if the speed-up capacitor has a capacitance several times larger than the load capacitance, degradation of the switching time of the gate circuit derived from the load capacitance, can be constrained.

For example, in a GaAs IC, a length of wire of about 1 mm is equal to the load capacitance of about 100 fF. Therefore, in this case, several hundred fF is enough for the capacitance of the speed-up capacitor. In the gate circuit according to the present invention, the reverse bias voltage of the reversely biased Schottky barrier diode functioning as a speed-up capacitor is about 0.5 V, so that a small area of several square microns can form a capacitor having a necessary and sufficient capacitance.

(5) In the circuit structure of FIG. 3, MESFETs 10 and 12 can be designed such that sufficient current flows therethrough for generating the reverse bias voltage of the Schottky barrier diode 11 and for transmitting the level shifted DC potential. In this case, transient drive current necessary for switching is supplied through the capacitance composed of the Schottky barrier diode. What is necessary in the normal state of the buffer stage is not a large current but the generation of a voltage which maintains the reverse bias condition of the Schottky barrier diode. Therefore, the current at the normal state of the buffer stage can be set to be small thereby decreasing the power consumption of the buffer stage. Consequently, a circuit having as small power consumption as that of the DCFL circuit can be implemented by the circuit structure of FIG. 3. With the restriction of small power consumption of about the same as the DCFL circuit, it provides a high load drivability due to the Schottky barrier diode.

(6) Either the normally-off type or a shallow normally-on type MESFETs may be employed. However, the circuit can be structured by employing only the normally-on type MESFETs having a threshold voltage to the extent of −500 mV. In addition, the circuit may be composed of MESFETs having one value for the threshold voltages. In this case, since the threshold voltages are of the same value, the wafer process can be simplified.

(7) Conventionally, in the DCFL circuit and the like, it is difficult to fabricate a NAND circuit and a composite gate since the logical swing is small. However, according to the present invention, a NAND circuit and a composite gate can be fabricated since the logical swing can be enlarged.

Figure 4:
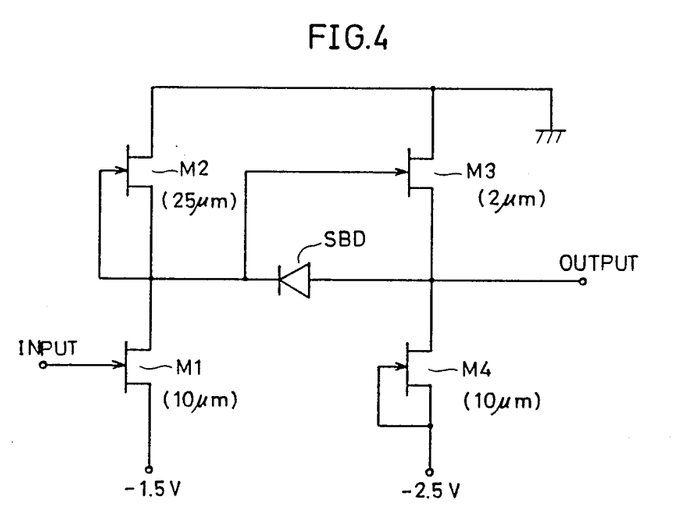
FIG. 4 is a schematic diagram similar to that of FIG. 3 with a further MESFET as a load and showing experimental parameters for confirming the effect of the logic gate circuit according to the present invention.

In FIG. 4 the load 8 of the circuit shown in FIG. 3 has been replaced by a load in the form of a further MESFET M2 for demonstrating the effect of the present invention.

In FIG. 4, the gate width of the MESFET M1 is 10 $\mu$m, the gate width of the MESFET M2 is 25 $\mu$m, the gate width of the MESFET M3 is 2 $\mu$m and the gate width of the MESFET M4 is 10 $\mu$m. The threshold voltages of the MESFETs M1 to M4 are all −0.4 V while the gate length thereof are all 1.2 $\mu$m.

The source of the MESFET M1 is connected to the potential of −1.5 V while the gate and source of the MESFET M4 are connected to the potential of −2.5 V.

The drains of the MESFET M2 and M3 are both connected to the ground potential. MESFETs M2 and M4 function as current sources.

Figure 5:
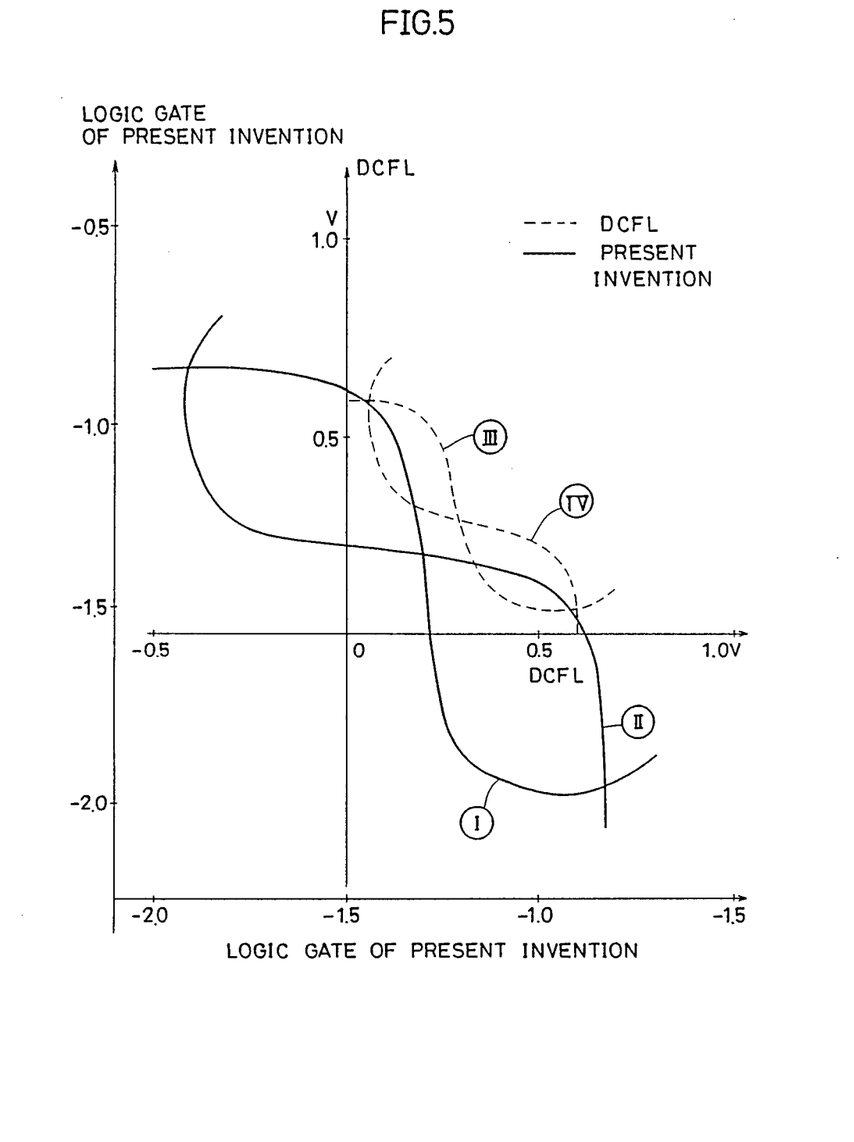
FIG. 5 is a graph showing signal transfer characteristics in the circuit arrangement of FIG. 4.

FIG. 5 is a graph showing the signal transmission characteristics in the circuit shown in FIG. 4. In FIG. 5, the abscissa denotes the input signal potential while the ordinate denotes the output signal potential.

The solid line I represents the transfer characteristics of the circuit shown in FIG. 4 while the solid line II represents a curve symmetrical to the solid line I with respect to a line of 45° inclination.

The dotted line III denotes the transfer characteristics of the DCFL circuit while the dotted line IV represent a curve symmetrical to the dotted line III with respect to the line of 45° inclination. The region enclosed by the solid lines I and II and the region enclosed by dotted lines III and IV represent the noise margins in the respective circuits.

As can be seen from the solid line I in FIG. 5, by using two power supplies of −1.5 V and −2.5 V, an output compatible with an ECL (Emitter Coupled Logic) circuit of about −0.8 V to −1.8 V can be obtained. This provides an extremely high practical value in considering the interface with an existing high speed logic circuit formed as an Si IC.

As may be seen from the comparison with the transfer characteristics of the DCFL circuit, that the logic gate circuit according to the present invention has a noise margin more than twice as large as that of the DCFL circuit. Namely, in the GaAs IC using the logic gate circuit according to the present invention, the tolerance of the process is extremely large compared with the DCFL circuit, thereby providing a high manufacturing yield.

Figure 6:
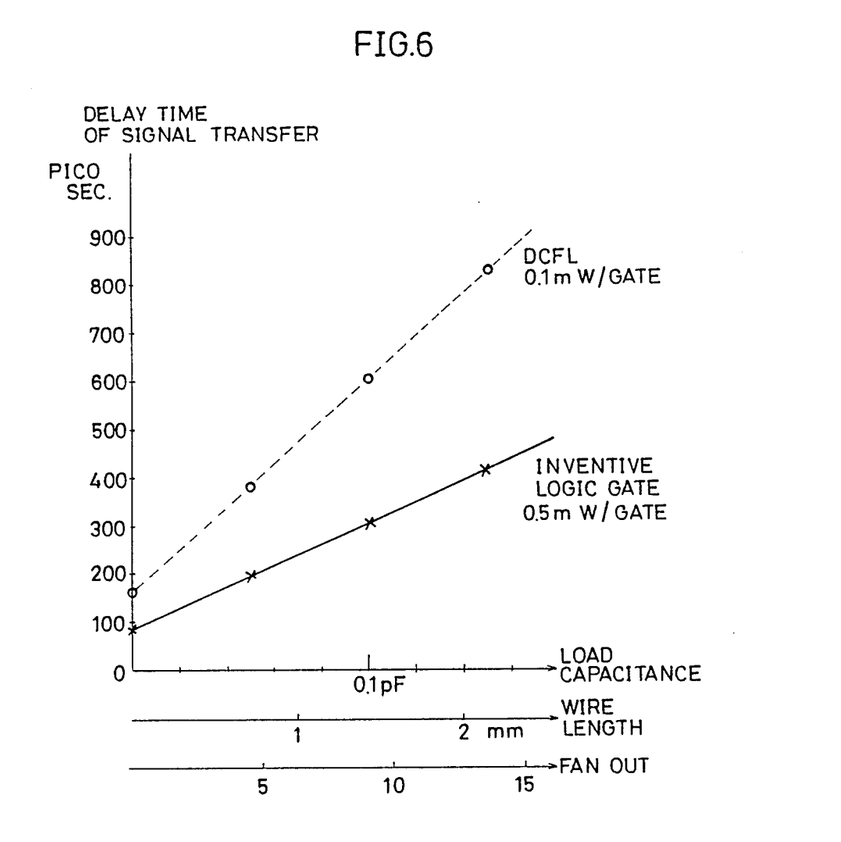
FIG. 6 is a graph showing propagation delay characteristics in the circuit arrangement shown in FIG. 4 with a capacitive load connected thereto.

FIG. 6 is a graph showing a relation between the capacitance value of the capacitive load and the operation speed (propagation delay time) in the circuit structure of FIG. 4. Referring to FIG. 6, the abscissa denotes the capacitance value of the capacitive load (wiring; fan-out) while the ordinate denotes the propagation delay time (unit: pico sec.). The solid line shows the characteristics of the logic gate circuit according to the present invention and the dotted line shows the characteristics of the DCFL circuit. The power consumption of the DCFL circuit is 0.1 mW per gate while the power consumption of the logic gate circuit according to the present invention is 0.5 mW per gate.

As may be seen from FIG. 6, although the logic gate circuit according to the present invention has a low power consumption of 0.5 mW/gate, the propagation delay time thereof is extremely high, e.g., it is about 250 pico sec. in driving the wire having 1 mm wire length. As it may be also seen from FIG. 6, an LSI (Large Scale Integrated Circuit) having some thousand gates can be implemented by using the logic gate circuit according to the present invention. In addition, it is also seen that the logic gate circuit according to the present invention operates about 2 times as fast as the DCFL circuit for the wiring or fan-out which is a typical capacitive load in a LSI.

Figure 7:
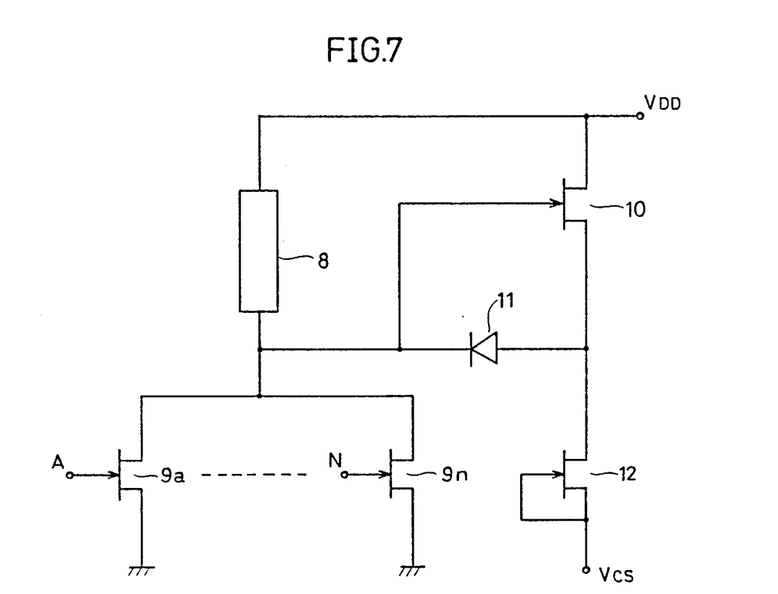
FIG. 7 is a schematic diagram showing the structure of a NOR circuit according to the present invention.

FIG. 7 is a schematic diagram of a logic gate circuit according to another embodiment of the present invention, wherein the switching stage forms a NOR circuit. Namely, MESFETs 9a to 9n receiving input signals A to N at respective gates are connected in parallel between the load 8 and the ground potential. In this circuit structure, the same effect as that of the above described embodiment can be obtained since the logical swing is large.

Figure 8:
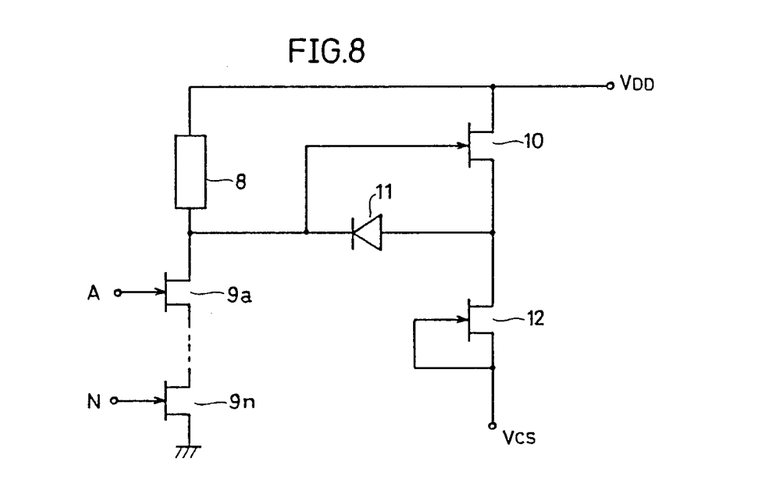
FIG. 8 is a schematic diagram showing the structure of a NAND circuit according to the present invention.

FIG. 8 is a schematic diagram showing a logic gate circuit according to still another embodiment of the present invention. In FIG. 8, the switching stage forms a NAND gate. Namely, MESFETs 9a to 9n receiving input signals A to N at respective gates are connected in series between the load 8 and the ground potential. The same effect as that of the above described embodiments can be obtained also in this circuit structure, since the output logical swing is large.

As described above, according to the present invention, a logic gate circuit having a necessary and sufficient output logical swing, superior rapid operation characteristics, high load drivability, and low power consumption can be implemented since the switching stage is composed of a load and at least one first MESFET, and the buffer stage for amplifying and level shifting the switching stage output is composed of the series connected second and third MESFETs and a Schottky barrier diode reversely biased and connected between the gate and source of the second MESFET.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device fabricated by using a compound semiconductor, comprising a load having a first load terminal connected to a first potential, and a second load terminal, a first Schottky gate field effect transistor connected between said second load terminal and a second potential, said first Schottky field effect transistor having a first gate for receiving an input signal applied externally to said first gate, a second Schottky gate field effect transistor having first and second conduction terminals and a second gate, said first conduction terminal being connected to said first potential and said second gate being connected to a node between said first Schottky gate field effect transistor and said load, a third Schottky gate field effect transistor having third and fourth conduction terminals and a third gate, said third conduction terminal of said third Schottky gate field effect transistor being connected directly to said second conduction terminal of said second Schottky gate field effect transistor, said third gate and said fourth conduction terminal being connected together to a third potential, and a Schottky barrier diode having a cathode connected to said second gate of said second Schottky gate field effect transistor and an anode connected to said second conduction terminal of said second Schottky gate field effect transistor and to said third conduction terminal of said third Schottky gate field effect transistor, and wherein said second gate of said second Schottky gate field effect transistor has a gate width which is smaller than a gate width of said third Schottky gate field effect transistor, whereby a potential difference is produced as a small level shift voltage between said second gate and said second conduction terminal.

2. The semiconductor device of claim 1, wherein said compound semiconductor is gallium arsenide.

3. The semiconductor device of claim 1, wherein the absolute value of the threshold voltage of said second Schottky gate field effect transistor is smaller than that of the threshold voltage of said third Schottky gate field effect transistor.

4. The semiconductor device of claim 1, wherein said first Schottky gate field effect transistor is a single Schottky gate field effect transistor.

5. The semiconductor device of claim 1, wherein said first Schottky gate field effect transistor comprises a plurality of Schottky gate field effect transistors connected in parallel with each other between said other conduction terminal of said load and said second potential for receiving input signals at respective gates.

6. The semiconductor device of claim 1, wherein said first Schottky gate field effect transistor comprises a plurality of Schottky gate field effect transistors connected in series with each other between said other conduction terminal of said load and said second potential for receiving input signals at respective gates.

7. A semiconductor device fabricated by using a compound semiconductor, comprising a load having a first load terminal connected to a first potential, and a second load terminal, a first Schottky gate field effect transistor connected between said second load terminal and a second potential, said first Schottky field effect transistor having a first gate for receiving an input signal applied externally to said first gate, a second Schottky gate field effect transistor having first and second conduction terminals and a second gate, said first conduction terminal being connected to said first potential and said second gate being connected to a node between said first Schottky gate field effect transistor and said load, a third Schottky gate field effect transistor having third and fourth conduction terminals and a third gate, said third conduction terminal of said third Schottky gate field effect transistor being connected directly to said second conduction terminal of said second Schottky gate field effect transistor, said third gate and said fourth conduction terminal being connected together to a third potential, and a Schottky barrier diode having a cathode connected to said second gate of said second Schottky gate field effect transistor and an anode connected to said second conduction terminal of said second Schottky gate field effect transistor and to said third conduction terminal of said third Schottky gate field effect transistor, and wherein the absolute value of the threshold voltage of said second Schottky gate field effect transistor is smaller than that of the threshold voltage of said third Schottky gate field effect transistor, whereby a potential difference is produced as a small level shift voltage between said second gate and said second conduction terminal.

8. A semiconductor device fabricated by using a compound semiconductor, comprising a load having a first load terminal connected to a first potential, and a second load terminal, a first Schottky gate field effect transistor connected between said second load terminal and a second potential, said first Schottky field effect transistor having a first gate for receiving an input signal applied externally to said first gate, a second Schottky gate field effect transistor having first and second conduction terminals and a second gate, said first conduction terminal being connected to said first potential and said second gate being connected to a node between said first Schottky gate field effect transistor and said load, a third Schottky gate field effect transistor having third and fourth conduction terminals and a third gate, said third conduction terminal of said third Schottky gate field effect transistor being connected directly to said second conduction terminal of said second Schottky gate field effect transistor, said third gate and said fourth conduction terminal being connected together to a third potential, and a Schottky barrier diode having a cathode connected to said second gate of said second Schottky gate field effect transistor and an anode connected to said second conduction terminal of said second Schottky gate field effect transistor and to said third conduction terminal of said third Schottky gate field effect transistor, wherein said second gate of said second Schottky gate field effect transistor has a gate width which is smaller than a gate width of said third Schottky gate field effect transistor, wherein said second potential is a negative bias potential for said first Schottky gate field effect transistor, and wherein said third potential is also a negative bias potential for said third Schottky gate field effect transistor, whereby a potential difference is produced as a small level shift voltage between said second gate and said second conduction terminal.

9. The semiconductor device of claim 8, wherein said second negative bias potential is $-1.5$ V, and wherein said third negative bias potential is $-2.5$ V.

* * * * *